(12) United States Patent
Schelling et al.

(10) Patent No.: US 9,281,280 B2
(45) Date of Patent: Mar. 8, 2016

(54) BONDING PAD FOR THERMOCOMPRESSION BONDING, PROCESS FOR PRODUCING A BONDING PAD AND COMPONENT

(71) Applicant: Robert Bosch GmbH, Stuttgart (DE)

(72) Inventors: Christoph Schelling, Stuttgart (DE); David Borowsky, Gerlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/954,649

(22) Filed: Jul. 30, 2013

(65) Prior Publication Data

US 2014/0035168 A1    Feb. 6, 2014

(30) Foreign Application Priority Data

Aug. 1, 2012  (DE) .................. 10 2012 213 548

(51) Int. Cl.
*H01L 23/00* (2006.01)
*H05K 3/40* (2006.01)
(Continued)

(52) U.S. Cl.
CPC .............. *H01L 23/564* (2013.01); *B81B 7/007* (2013.01); *H01L 24/11* (2013.01); *H01L 24/13* (2013.01); *H01L 24/27* (2013.01); *H01L 24/29* (2013.01); *H01L 24/30* (2013.01); *H01L 24/73* (2013.01); *H01L 24/81* (2013.01); *H01L 24/83* (2013.01); *H01L 24/92* (2013.01); *H05K 1/111* (2013.01); *H05K 3/4007* (2013.01); *B81C 2201/019* (2013.01); *B81C 2203/035* (2013.01); *H01L 24/16* (2013.01); *H01L 24/32* (2013.01); *H01L 2224/0401* (2013.01); *H01L 2224/04026* (2013.01); *H01L 2224/1147* (2013.01); *H01L 2224/1181* (2013.01); *H01L 2224/11462* (2013.01); *H01L 2224/11825* (2013.01); *H01L 2224/13011* (2013.01); *H01L 2224/13022* (2013.01); *H01L 2224/13124* (2013.01); *H01L 2224/13144* (2013.01); *H01L 2224/13147* (2013.01); *H01L 2224/13155* (2013.01); *H01L 2224/13644* (2013.01); *H01L 2224/13647* (2013.01); *H01L 2224/13664* (2013.01); *H01L 2224/13669* (2013.01);
(Continued)

(58) Field of Classification Search
CPC ...... H01L 23/564; H01L 23/00; H05K 1/111; H05K 3/4007; H05K 3/40; H05K 1/11
See application file for complete search history.

(56) References Cited

U.S. PATENT DOCUMENTS 737,560 A    8/1903  Nunnally
5,508,228 A *  4/1996  Nolan et al. .................. 438/614
(Continued)

OTHER PUBLICATIONS

Froemel et al., "Investigations of thermocompression bonding with thin metal layers", Proceedings of Transducers, Jun. 2011, Beijing, China, pp. 990-993.

*Primary Examiner* — Peniel M Gumedzoe
(74) *Attorney, Agent, or Firm* — Maginot, Moore & Beck LLP

(57) ABSTRACT

A bonding pad for thermocompression bonding of a carrier material to a further carrier material includes a base layer and a top layer. The base layer is made of metal, is deformable, and is connected to the carrier material. The metal is nickel-based. The top layer is metallic and is connected directly to the base layer. The top layer is arranged at least on a side of the base layer which faces away from the carrier material. The top layer has a smaller layer thickness than the base layer. In at least one embodiment, the top layer has a greater oxidation resistance than the base layer.

9 Claims, 5 Drawing Sheets

(51) Int. Cl.
   *H05K 1/11* (2006.01)
   *B81B 7/00* (2006.01)

(52) U.S. Cl.
   CPC .......... *H01L 2224/2747* (2013.01); *H01L 2224/2781* (2013.01); *H01L 2224/27462* (2013.01); *H01L 2224/27825* (2013.01); *H01L 2224/29011* (2013.01); *H01L 2224/29022* (2013.01); *H01L 2224/29035* (2013.01); *H01L 2224/2957* (2013.01); *H01L 2224/29124* (2013.01); *H01L 2224/29147* (2013.01); *H01L 2224/29155* (2013.01); *H01L 2224/29166* (2013.01); *H01L 2224/29181* (2013.01); *H01L 2224/29186* (2013.01); *H01L 2224/29562* (2013.01); *H01L 2224/29644* (2013.01); *H01L 2224/29647* (2013.01); *H01L 2224/29664* (2013.01); *H01L 2224/29669* (2013.01); *H01L 2224/32227* (2013.01); *H01L 2224/73103* (2013.01); *H01L 2224/73203* (2013.01); *H01L 2224/8183* (2013.01); *H01L 2224/81193* (2013.01); *H01L 2224/81203* (2013.01); *H01L 2224/8383* (2013.01); *H01L 2224/83193* (2013.01); *H01L 2224/83203* (2013.01); *H01L 2224/9211* (2013.01); *H01L 2924/00013* (2013.01); *H01L 2924/1461* (2013.01)

(56) References Cited

U.S. PATENT DOCUMENTS

| | | | |
|---|---|---|---|
| 5,833,824 A * | 11/1998 | Benton | 204/416 |
| 7,005,743 B2 * | 2/2006 | Iwatsu et al. | 257/737 |
| 7,737,560 B2 | 6/2010 | Stecher et al. | |
| 2002/0090756 A1 | 7/2002 | Tago et al. | |
| 2003/0104651 A1 | 6/2003 | Kim et al. | |
| 2010/0218980 A1 * | 9/2010 | Furuta et al. | 174/257 |
| 2010/0283138 A1 | 11/2010 | Chen et al. | |
| 2012/0164854 A1 * | 6/2012 | Wang | 439/78 |

\* cited by examiner

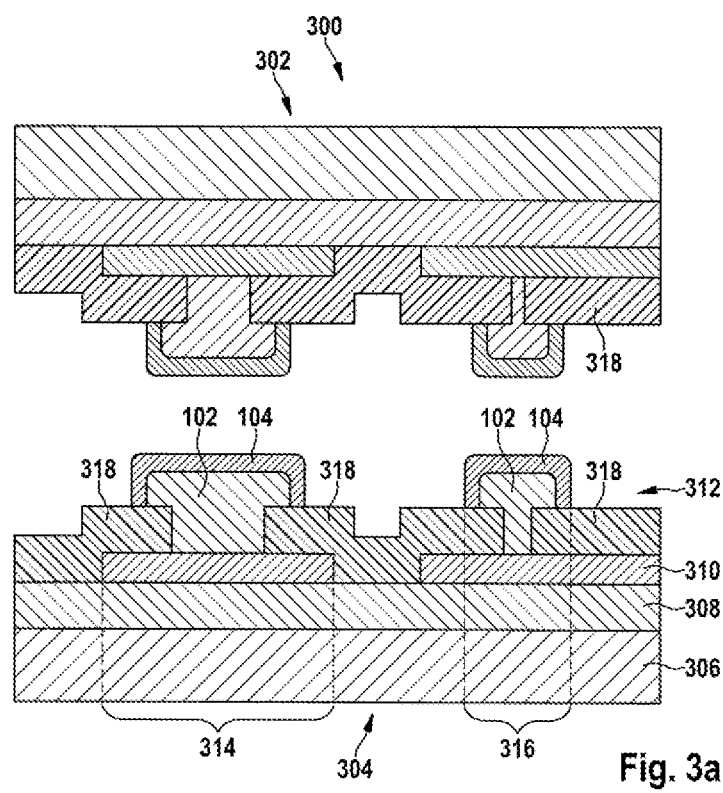

BONDING PAD FOR THERMOCOMPRESSION BONDING, PROCESS FOR PRODUCING A BONDING PAD AND COMPONENT

This application claims priority under 35 U.S.C. §119 to patent application no. DE 10 2012 213 548.0, filed on Aug. 1, 2012 in Germany, the disclosure of which is incorporated herein by reference in its entirety.

BACKGROUND

The present disclosure relates to a bonding pad for thermocompression bonding, to a component and also to a process for producing a bonding pad.

In thermocompression bonding, two metallic faces can be permanently connected to one another. To this end, the faces are pressed onto one another with a high pressure and at an elevated temperature until restructuring of the crystal grains which leads to a bond between the faces is effected at the contact interface of the metals.

By way of example, US 2010 283 138 A1 describes a process in which nickel is used as the bonding metal for a MEMS component. In this case, the bond is effected directly by way of the nickel layers. Here, a nickel-based material is connected to a further nickel-based material or an aluminum-based material at a connection point.

A plurality of metals can be used for wafer bonding by means of the thermocompression bonding process. These metals are described in a number of publications (e.g. "Investigations of thermocompression bonding with thin metal layers", Proceedings of Transducers 11). In this respect, Al, Cu and Au are common. In the case of Al and Cu, there is the risk of oxide formation on the surface before the bonding, which can have an adverse effect on the adhesion to the bonding interface. Au as a bonding metal here has advantages, but it is relatively expensive to produce in thick layers.

U.S. Pat. No. 7,737,560 describes a process for forming a wire bonding connection with the aid of ultrasound, said process using a layered bonding pad metal system with an Ni-containing layer and a passivation layer, e.g. of Pd and Au, located thereabove.

Against this background, the present disclosure proposes a bonding pad for thermocompression bonding, a component and also a process for producing a bonding pad according to the description below. Advantageous configurations become apparent from the description which follows.

SUMMARY

A nickel-based bonding material has ductile properties, which is favorable, for example, for compensating for manufacturing tolerances and irregularities of a contact face. However, the nickel-based material is susceptible to oxidation, which can lead to oxide inclusions and therefore instances of a lack of tightness or contact problems at a connection point.

The disclosure is based on the understanding that the nickel-based material can make up a large proportion of the volume of a bonding pad, in order to provide the desired ductile properties. The nickel-based material can be protected from the oxidation by a passivating, thin metallic top layer.

The top layer advantageously has a very small layer thickness and therefore crystallite sizes compared to the nickel-based material. On account of the small crystallite size, a large number of crystallites are available per unit area as growth nuclei, which can grow into the face against which they are pressed during the thermocompression bonding.

The thickness of the metallic top layer can have a fixed relationship with the thickness of the nickel-based base layer, e.g. one tenth to one fifth.

The present disclosure provides a bonding pad for the thermocompression bonding of a carrier material to a further carrier material, the bonding pad having the following features:

a deformable, thick base layer made of metal, which is connected to the carrier material, the metal being nickel-based; and at least one metallic top layer, which is connected directly to the base layer and is arranged at least on a side of the base layer which faces away from the carrier material, wherein the top layer has a smaller layer thickness than the base layer, in particular wherein the top layer has a greater oxidation resistance than the base layer.

The present disclosure furthermore provides a component having the following features:

a first carrier material, which on a first surface has at least one electrically conductive bonding pad according to the approach proposed here;

a second carrier material, which is arranged at a distance from the first carrier material and, on a second surface of the second carrier material which faces toward the first surface, has a contact point which is arranged lying opposite the bonding pad and rests on the bonding pad, wherein a contour of the bonding pad corresponds to an outline of the contact point within a tolerance range, and the contact point is connected to the bonding pad, in particular wherein the contact point has been connected to the bonding pad by thermocompression bonding.

The present disclosure furthermore provides a process for producing a bonding pad on a carrier material, the process comprising the following steps:

depositing a nickel-based deformable base layer made of metal on the carrier material;

depositing a metallic top layer directly on a side of the base layer which faces away from the carrier material, wherein the top layer has a smaller layer thickness than the base layer, e.g. a layer thickness of one tenth to one fifth that of the base layer, in particular wherein the top layer has a greater oxidation resistance than the base layer.

A bonding pad can be understood to mean a contact-connection device which is configured to be integrally connected to a further bonding pad at a temperature which is lower than a liquidus temperature of the top layer material. The bonding pad and the further bonding pad are pressed against one another for connection with a high pressure, while the temperature is active. This forms an irreversible connection between the bonding pads similar to the procedures in diffusion welding. Here, crystallites grow over an interface between the bonding pads and give rise to an electrically conductive connection which can bear mechanical loads. A carrier material can be a substrate, for example a wafer or chip. The carrier material can have a contact pad at a point of the bonding pad. The contact pad can be made, for example, of aluminum, copper, titanium, tantalum, AlSi, AlSiCu, AlCu, TiN, TiW, TaN. By way of example, a nickel-based metal can be a metal which at least partially comprises nickel or is elemental nickel. The nickel-based metal can also be NiP, NiMoP, NiPd, NiB, NiCo. A top layer can be a metallic passivation (layer). The top layer can ideally have a lesser tendency to oxidation than the base layer. A lesser tendency to oxidation can be understood to mean a property in accordance with which the material of the top layer oxidizes more slowly than the material of the base layer upon exposure to an oxygen-containing medium. The top layer can in particular have crystallites with a smaller crystallite size than the base layer. By way of example, the thickness of the top layer can lie in the nanometer range. A component can be a sensor, for example. A contact point can be a contact pad. The bonding pad can have a similar shape to the contact point. By way of example, the bonding pad can be larger or smaller than the contact point. A tolerance range can have, for example, an order of magnitude of between 1 µm and 500 µm. Deposition can be, for example, a change in phase from a liquid or gaseous state to a solid state. By way of example, the metal can accumulate on the carrier material and/or on metal of the base layer during the deposition.

At least one of the steps of deposition can be effected by means of an electrochemical deposition process. An electrochemical deposition process can be understood to mean, for example, the accumulation of metal ions on an anode or cathode during an electroplating process. As a result of electron exchange with the metal ions, the metal ions can crystallize to form metal crystallites. Both large and very small layer thicknesses can be achieved by the electrochemical deposition process. Uniform layer thicknesses can be achieved over the surface of the bonding pad by the electrochemical deposition process. It is therefore possible to achieve a very smooth surface having particularly good bonding properties.

The process can comprise a step of applying and structuring a masking layer on the carrier material, in order to obtain a mask for the steps of deposition. A masking layer can be an electrically non-conductive layer. The masking layer can have an opening where the bonding pad is to be arranged. The bonding pad can be positioned very precisely by way of a mask.

The process can comprise a step of cleaning the top layer. Cleaning can be additional smoothing of the top layer in order to further improve the bonding properties of the top layer. By way of example, the cleaning can be carried out by means of a plasma treatment and/or a gas treatment and/or by wet chemical means.

The top layer can consist of at least one layer consisting at least partially of at least one of the materials palladium, gold, platinum, copper. Palladium, gold and platinum are precious metals. Copper is a semiprecious metal. The metals have a high corrosion resistance. Under a normal atmosphere, these metals do not oxidize or oxidize scarcely. As a result, the bonding pad can be temporarily stored, for example, without a protective atmosphere.

The layer thickness of the base layer can have a predefined relationship with the layer thickness of the top layer. A predefined relationship can be, for example, a relationship such as, for example, one fifth, more expediently at least one tenth of the layer thickness of the top layer in relation to the layer thickness of the base layer. A high reliability can be achieved by a predefined relationship.

A subarea of the top layer can be planar and/or can be arranged parallel to a surface of the carrier material. A predefined homogeneous contact face can be achieved by virtue of a planar subarea. Owing to the parallel orientation of the subarea, a contact pressure can act normal to the subarea during bonding and the bonding connection can be achieved particularly effectively.

The contact point on the second carrier material can be formed as a further bonding pad in accordance with the approach proposed here. Two bonding pads of the same type can provide a particularly secure connection.

The contour of the two bonding pads can be closed circumferentially like a ring around an inner space between the first carrier material and the second carrier material. As an alternative or in addition, the outline of the contact point can be closed circumferentially like a ring around the inner space. The bonding pad and the contact point can form a bonding frame, and the inner space can be a hollow space. The inner space can be hermetically sealed off with respect to the surroundings.

The component can have at least one additional bonding pad and at least one additional contact point. An additional bonding pad and an additional contact point can form a further bonding connection. By way of example, an electrical connection can thus be made between the first carrier material and the second carrier material.

The bonding pad and the additional bonding pad can have the same height. The faces can be arranged on a plane. The bonding pad and the additional bonding pad can be produced during the same manufacturing steps.

At least the first carrier material can have a MEMS sensor element. A MEMS sensor element can be a microelectromechanical sensor element. By way of example, the MEMS sensor element can be arranged within the inner space in order to be protected from contamination or in order to be able to include a certain internal pressure.

For the electrical and hermetic connection, the surfaces of the bonding pads are advantageously raised on at least one of the carrier materials compared to the rest of the surface, and lie in each case on the same level, e.g. in that they have the same layer substructure or the surface is planarized before or after the application of the wafer bonding metallizations.

Furthermore, it is expedient if the corresponding bonding pads on one of the two carrier materials are dimensioned to be smaller, such that large contact faces nevertheless materialize even in the case of topography at the bonding edges.

BRIEF DESCRIPTION OF THE DRAWINGS

The disclosure will be explained in more detail hereinbelow by way of example with reference to the accompanying drawings, in which:

FIG. 3a shows a sectional illustration of a component according to an exemplary embodiment of the present disclosure;

In the following description of preferred exemplary embodiments of the present disclosure, identical or similar reference signs are used for the elements acting in a similar manner as shown in the various figures, with a repeated description of these elements being dispensed with.

DETAILED DESCRIPTION

Figure 1:
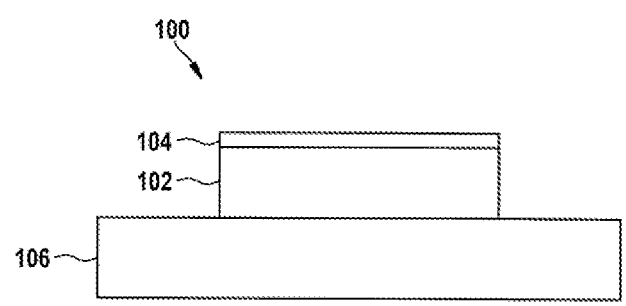
FIG. 1 shows a block diagram of a bonding pad according to an exemplary embodiment of the present disclosure.

FIG. 1 shows a block diagram of a bonding pad 100 according to an exemplary embodiment of the present disclosure. The bonding pad 100 has a base layer 102 and a top layer 104. The base layer 102 is arranged on a carrier material 106. The base layer 102 is connected directly to the carrier material 106. The base layer 102 is metallic and nickel-based, i.e. it comprises a metal which at least partially contains nickel. On account of the base metal being nickel, the base layer 102 is ductile, i.e. deformable. The base layer 102 is arranged between the top layer 104 and the carrier material 106. In this exemplary embodiment, the carrier material 106 is a wafer, for example made of silicon with a coating consisting of an insulating layer, e.g. made of silicon oxide. The base layer 102 has been applied to the carrier material 106 by means of an electrochemical deposition process. The top layer 104 is connected directly to the base layer 102. The top layer 104 is metallic. The top layer 104 is thinner than the base layer 102 many times over. Owing to the small layer thickness of the top layer 104, the crystallites in the top layer 104 are smaller than in the base layer 102. The top layer 104 is made of a metal with a greater oxidation resistance than the base layer 102. The top layer 104 has been applied to the base layer 102 by means of an electrochemical deposition process. The top layer 104 is planar and smooth. The bonding pad 100 is configured to be connected to another bonding pad by means of a thermocompression bonding process. Owing to the small size of the crystallites in the top layer 104, the bonding connection to the other bonding pad can be made in a particularly reliable manner.

In other words, FIG. 1 shows a metallization 100 for the thermocompression bonding. The layer system presented here makes it possible to produce a reliable, cost-effective bonding connection. The bond is corrosion-resistant and provides a hermetically tight bonding connection and a low electrical contact resistance with little resistance scattering. The metallization 104 makes a robust bonding process possible.

Figure 2:
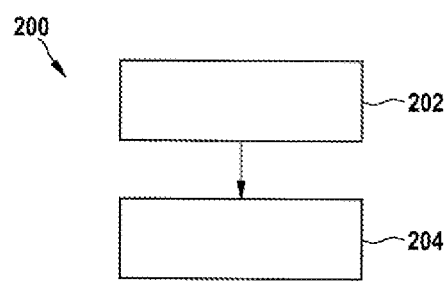
FIG. 2 shows a flow chart of a process for producing a bonding pad on a carrier material according to an exemplary embodiment of the present disclosure.

FIG. 2 shows a flow chart of a process 200 for producing a bonding pad on a carrier material according to an exemplary embodiment of the present disclosure. The process 200 comprises two successive steps 202, 204 of deposition. The bonding pad corresponds to a bonding pad as described in FIG. 1. In the first step 202 of deposition, a base layer is deposited on the carrier material. In the second step 204 of deposition, a top layer is deposited on the base layer. In the first step 202 of deposition, the nickel-based, deformable base layer made of metal is deposited on the carrier material by electrochemical means, for example. In the second step 204 of deposition, the metallic top layer is deposited directly on a side of the base layer which faces away from the carrier material by electrochemical means, for example. During the electrochemical deposition, electric current is conducted between two poles by an electrolyte. In this case, metal ions from the electrolyte are precipitated on a cathode, as a result of which a metallic deposit forms as a layer in the deposition steps 202, 204. In this exemplary application, the carrier material or the bonding pad is the cathode. At points at which the carrier material is electrically insulated, for example by a mask, no deposit is effected. The top layer has a smaller layer thickness than the base layer. The top layer has a greater oxidation resistance than the base layer.

By virtue of the process 200 described here, small crystallite sizes arise on account of a thin top layer. The small crystallite sizes allow for a rapid rearrangement and therefore a robust bonding connection.

Smooth surfaces form by virtue of electrodeposition processes as in step 202 and 204.

The deposition can also be effected in an electroless manner without bonding to the wafer edge.

The process 200 proposed here makes it possible to establish a corrosion-resistant bonding connection which creates a defined distance between two substrates.

Figure 3B:
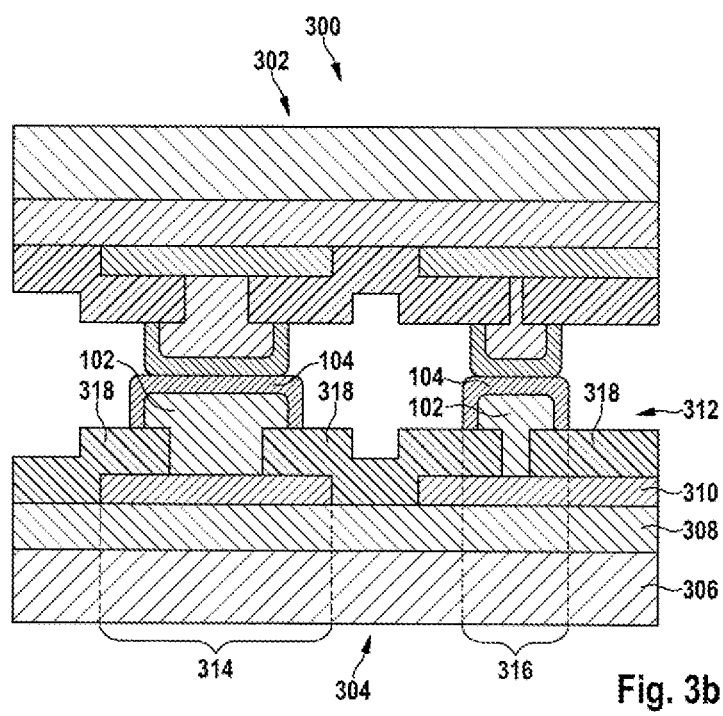
FIG. 3b shows a further sectional illustration of the component according to an exemplary embodiment of the present disclosure.

FIGS. 3a and 3b show an illustration of a component 300 according to an exemplary embodiment of the present disclosure. Here, FIG. 3a shows, by way of example, a cross section of an exemplary embodiment of a bonding metallization according to the disclosure before bonding in a detailed view. FIG. 3b shows, by way of example, a cross section of an exemplary embodiment of a bonding metallization according to the disclosure after bonding in a detailed view.

The component 300 has a top part 302 and a bottom part 304. In the illustration, the top part 302 is arranged above the bottom part 304. The top part 302 is configured in mirror image with respect to the bottom part 304. The two parts 302, 304 each have a layer of substrate 306, a layer of layer substructure 308, a layer of chip wiring 310 and a layer of bonding metallization 312. In terms of structure, the bonding metallization 312 here corresponds to a bonding pad according to an exemplary embodiment of the present disclosure as shown in FIG. 1. The substrate 306, the layer substructure 308 and the chip wiring 310 are combined in FIG. 1 as the carrier material on which the bonding pads are constructed. The bottom part 304 is described hereinbelow. The top part 302 has an analogous configuration. The substrate 306 is a carrier layer, for example made of silicon. In the example of the bottom part 304, the substrate 306 is the bottommost layer. The layer substructure 308 is arranged directly on the substrate 306. The layer substructure 308 is made of silicon oxide. The layer substructure 308 has varied properties, in order to be able to arrange further structures thereon. The chip wiring 310 is arranged directly on the layer substructure 308. The chip wiring 310 is electrically conductive and is shaped in the form of conductor tracks and/or contact pads. In this exemplary embodiment, the wiring 310 forms a region in which a bonding sealing frame 314 is arranged, and a region in which bonding contacts 316 are formed. The conductor tracks and contact pads have intermediate spaces for electrical insulation. The chip wiring 310 is covered at least partially by a layer of dielectric material 318. The dielectric layer 318 can serve as a mask for the application of the bonding metallization 312 during the production process. The dielectric layer 318 has openings in the region of the chip wiring 310. In the deposition step as described in FIG. 2, the openings have been filled with the base layer 102. The base layer here is a thick, compliant, nickel-containing base metallization. The base layer 102 has been applied in a greater thickness than the dielectric layer 318. Once the openings were filled, the base layer 102 has also grown laterally over the dielectric layer 318. The base layer 102 therefore has a mushroom shape. The base layer 102 has a planar, smooth surface oriented substantially parallel to a surface of the chip wiring 310 in the openings. The surface in the region of the bonding sealing frame 314 is in this case arranged in the same plane as the surface in the region of the bonding contacts 316. An edge of the surfaces is rounded off and merges into flanks of the base layer 102. The top layer 104 has been applied to the surface and the flanks in a further deposition step. The top layer 104 here is a thin, metallic passivation, for example made of a precious metal. The top layer 104 is uniformly thin. The openings in the dielectric layer 318 of the top part 302 are smaller than the openings in the bottom part 304 by a small magnitude. As a result, the planar surface of the bonding metallizations 312 of the top part 302 is likewise smaller by the magnitude.

FIG. 3a shows the component 300 before bonding. The bonding metallizations 312 of the bonding frame 314 and also of the bonding contacts 316 are oriented in relation to one another and spaced apart from one another. In the state shown, the top layer 104 can be cleaned, for example, in order to make a further improved bonding connection possible.

FIG. 3b shows the component 300 after bonding. The bonding metallizations 312 of the bonding frame 314 and also of the bonding contacts 316 have been pressed onto one another with a bonding pressure during the bonding, while the component was heated to a bonding temperature. In this case, the surfaces of the bonding pads have been pressed into such close contact that diffusion processes have set in in both surfaces, and have led to a crystallite growth at the interface and to a permanent connection between the top part 302 and the bottom part 304. The bonding connection is free of inclusions and therefore fluid-tight owing to the high surface quality of the top layer 104.

In other words, FIG. 3b shows a detailed view of a component 300 consisting of at least two substrates 302, 304 (e.g. wafers, chips) which are connected to one another by way of a metallic wafer bonding connection. The metallic wafer bonding connection 312 consists of a plurality of layers 102, 104, where a nickel-based base metallization 102 (e.g. Ni, NiP, NiMoP, NiPd, NiB, NiCo) is located on a contact pad of the bonding connection 312 (e.g. made of Al, AlSi, AlSiCu, AlCu, Cu, Ti, TiN, TiW, Ta, TaN) and a metallic top layer 104 is located above it.

The metallic passivation layer 104 can consist of at least one layer made from at least one of the materials Pd, Au, Pt, Cu.

The metallic wafer bonding connection 312 can provide both at least one electrical connection 316 and a hermetic sealing connection ("bonding frame") 314 closed like a ring between the at least two substrates 302, 304.

A MEMS component can be integrated on at least one of the carrier materials 302, 304.

For the electrical and hermetic connection, the surfaces of the wafer bonding metallizations 312 can be raised in each case on the carrier materials 302, 304 compared to the rest of the surface, and lie on a carrier material on the same level, e.g. in that they have the same layer substructure or in that the surface is planarized before or after the application of the wafer bonding metallizations 312.

The metallic wafer bonding connection 312 can have lateral structural widths in at least one direction of between 1 μm and 500 μm.

A defined distance of 0.5 μm to 20 μm between the at least two carrier materials 302, 304 can be set by the metallic wafer bonding connection 312.

Figure 4:
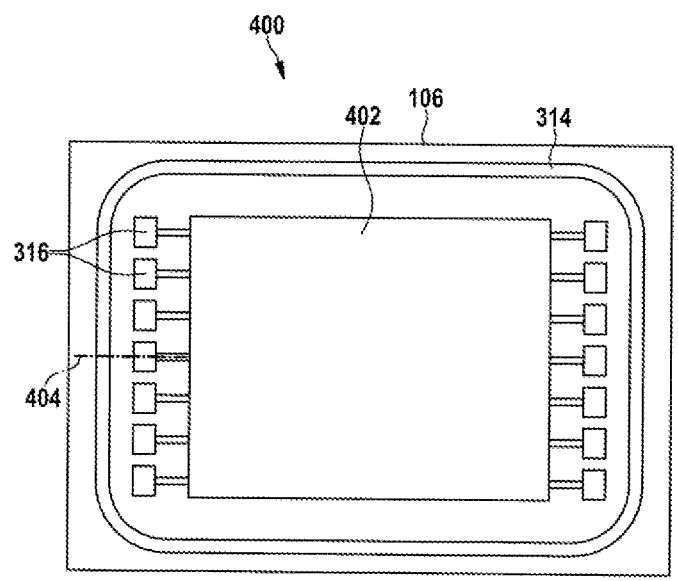
FIG. 4 shows a plan view of a chip according to an exemplary embodiment of the present disclosure.

FIG. 4 shows a plan view of a chip 400 according to an exemplary embodiment of the present disclosure. What is shown is a plan view of a typical component arrangement with a bonding metallization. The chip 400 has a bonding frame 314, a plurality of bonding contacts 316 and a functional region 402. The bonding frame 314, the bonding contacts 316 and the functional region 402 are arranged on a carrier material 106. FIG. 3 shows a detailed cross section along a line of intersection 404 through the bonding frame 314 and one of the bonding contacts 316. The chip wiring 310 connects in each case one of the bonding contacts 316 to the functional region 402. The bonding frame 314 is not connected to the functional region 402. By way of example, semiconductor structures and MEMS structures are integrated in the functional region 402. The functional region 402 is shown as a rectangle. In each case seven bonding contacts 316 are arranged at identical intervals in relation to one another on opposing narrow sides of the functional region 402 at a distance from the functional region 402. The bonding frame 314 surrounds the functional region 402 and the bonding contacts 316 in the form of a rounded rectangle. The bonding frame 314 is at a distance from the functional region 402 and the bonding contacts 316.

Figure 5:
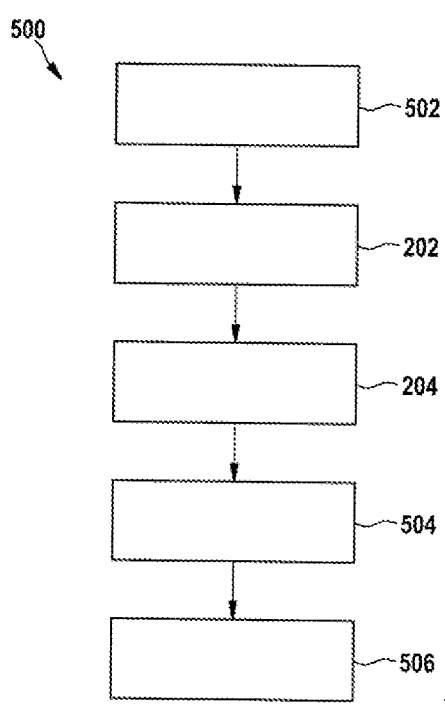
FIG. 5 shows a flow chart of a process for connecting two substrates according to an exemplary embodiment of the present disclosure.

FIG. 5 shows a flow chart of a process 500 for connecting two substrates. The following process steps are carried out on the at least two carrier materials to be connected to one another.

Applying 502 and structuring a non-conductive masking layer, e.g. made of polyimide, silicon nitride.

Depositing 202 a nickel-containing layer (e.g. Ni, NiP, NiMoP, NiPd, NiB, NiCo) on a base metallization, e.g. by means of an electrochemical deposition process.

Depositing 204 at least one further thin, metallic passivation and bonding layer (e.g. Pd, Au, Pt, Cu), e.g. by means of an electrochemical deposition process.

Thermocompression bonding 504 of the at least two carrier materials.

Post-bond annealing 506 for strengthening the adhesive bond.

A step of removing the masking layer before bonding is optionally possible. Cleaning and/or conditioning of the bonding metal surfaces by means of a plasma treatment (e.g. Ar backsputtering) and/or a forming gas treatment and/or wet-chemical cleaning before bonding are similarly possible.

The wafer bonding connection described or the process 500 can be used for producing infrared sensor arrays, acceleration sensors, rate-of-rotation sensors, pressure sensors, etc.

For the thermocompression bonding in step 504, it is advantageous if the bonding surfaces are as smooth as possible and all lie on one plane on the respective carrier material. Then, large regions of the bonding faces initially come into contact during the bonding process. Electrochemical deposition processes as described in steps 202 and 204 are particularly well-suited for producing smooth surfaces. With these, it is also possible to coat selectively determined regions and to realize both very thin layers (a few nm) and also very thick layers having a thickness of a plurality of μm.

During the thermocompression bonding 504, (re)crystallization and grain growth of grains arise at the contact faces as a result of (inter)diffusion processes on both sides of the bonding face, which leads to the adhesion of the bonding interfaces to one another. In the case of thin layers, the grains are considerably smaller, the surfaces are less rough and rearrangement during bonding can therefore be effected more quickly and to a more complete extent than in the case of thick layers.

Furthermore, it is expedient if the bonding metallization is to some extent compliant and can absorb elastic mechanical stresses. Particularly in the case of wafers which are to be bonded to one another with a deflection, this leads to a better bonding homogeneity over the wafer and provides protection against damage in the layer substructure. Nickel-containing layers are distinguished by this property.

For reasons of process compatibilities, bonding connections which can perform at low temperatures and withstand the nevertheless subsequently high temperatures are also advantageous. Bonding metals having low diffusion energies, which is usually accompanied by low bonding energies and melting temperatures, are therefore of particular interest.

If the bonding metallization is used as a sealing element for a vacuum inclusion, attention is also to be paid to the corrosion resistance. This also helps to avoid oxidation of the bonding surface before bonding. Metallizations with precious metals such as, for example, Pd, Au, Pt are therefore particularly advantageous. To improve the adhesion and avoid interdiffusion of these precious metal layers, intermediate layers can be included, e.g. Pd, Ti, Ta, TiW, TaN.

The approach presented here proposes a metal system for wafer bonding which combines all the properties described to date. It consists of a thicker, nickel-containing layer and at least one passivating, thinner top layer (e.g. Pd, Au, Pt, . . . ) lying thereabove.

The approach presented here can be used in all applications in which a hermetic seal and/or an electrical contact has to be provided between two carrier materials. This can be the case, for example, for the production of infrared sensor arrays, acceleration sensors, rate-of-rotation sensors, pressure sensors, . . . .

The exemplary embodiments which are described and shown in the figures are chosen only by way of example. Different exemplary embodiments can be combined with one another as a whole or in respect of individual features. An exemplary embodiment can also be supplemented with features of a further exemplary embodiment.

Furthermore, process steps according to the disclosure can be repeated, and can also be carried out in an order different to that described.

Where an exemplary embodiment comprises an "and/or" combination between a first feature and a second feature, this is to be read as meaning that the exemplary embodiment has both the first feature and the second feature according to one embodiment and either only the first feature or only the second feature according to a further embodiment.

What is claimed is:

1. A component, comprising:
   a first carrier material, which on a first surface, has at least one bonding pad, the at least one bonding pad including:
      a deformable base layer made of metal, which is connected to the first carrier material, the metal being nickel-based; and
      a metallic top layer connected directly to the deformable base layer and arranged at least on a side of the deformable base layer which faces away from the first carrier material,
      wherein a layer thickness of the metallic top layer is smaller than a layer thickness of the deformable base layer, and
      wherein an oxidation resistance of the metallic top layer is greater than an oxidation resistance of the deformable base layer; and
   a second carrier material arranged at a distance from the first carrier material and having a second surface which faces toward the first surface of the first carrier material,
   wherein the second carrier material has, on the second surface, a contact point which is arranged lying opposite the at least one bonding pad and is configured to rest on the at least one bonding pad,
   wherein the contact point is connected to the at least one bonding pad,
   wherein a contour of the at least one bonding pad is configured to correspond to an outline of the contact point within a tolerance range, and
   wherein the contact point is formed as a further bonding pad, the further bonding pad including:
      a further deformable base layer made of metal, which is connected to the second carrier material, the metal being nickel-based; and
      a further metallic top layer connected directly to the further deformable base layer and arranged at least on a side of the further deformable base layer which faces away from the second carrier material,
      wherein a layer thickness of the further metallic top layer is smaller than a layer thickness of the further deformable base layer, and
      wherein an oxidation resistance of the further metallic top layer is greater than an oxidation resistance of the further deformable base layer.

2. The component according to claim 1, wherein at least one of the contour of the bonding pad and the outline of the contact point is closed circumferentially like a ring around an inner space between the first carrier material and the second carrier material.

3. The component according to claim 1, further comprising:
   at least one additional bonding pad; and
   at least one additional contact point.

4. The component according to claim 3, wherein a height of the bonding pad and a height of the at least one additional bonding pad are the same over the surface of the carrier material.

5. The component according to claim 1, wherein at least the first carrier material has a MEMS sensor element.

6. The component according to claim 1, wherein:
   at least one of the first carrier material and the second carrier material includes a chip wiring layer partially covered by a dielectric layer,
   the dielectric layer includes at least one opening in a region of the chip wiring, and
   the deformable base layer fills the at least one opening.

7. The component according to claim 1, wherein:
   at least one of the first carrier material and the second carrier material includes a chip wiring layer partially covered by a dielectric layer,
   the metallic top layer corresponding to the at least one of the first carrier material and the second carrier material directly contacts the dielectric layer such that the metallic top layer and the dielectric layer completely cover top and side surfaces of the deformable base layer corresponding to the at least one of the first carrier material and the second carrier material.

8. The component according to claim 1, wherein:
   the first carrier material includes a first chip wiring layer partially covered by a first dielectric layer,
   the first dielectric layer includes at least one opening in a region of the first chip wiring layer,
   the deformable base layer fills the at least one opening,
   the second carrier material includes a second chip wiring layer partially covered by a second dielectric layer,
   the second dielectric layer includes at least one opening in a region of the second chip wiring layer, and
   the further deformable base layer fills the at least one opening.

9. The component according to claim 1, wherein:
   the first carrier material includes a first chip wiring layer partially covered by a first dielectric layer,
   the metallic top layer directly contacts the first dielectric layer such that the metallic top layer and the dielectric layer completely cover the deformable base layer,
   the second carrier material includes a second chip wiring layer partially covered by a second dielectric layer, and
   the further metallic top layer directly contacts the second dielectric layer such that the further metallic top layer and the dielectric layer completely cover top and side surfaces of the further deformable base layer.

* * * * *